(12) United States Patent
Yan et al.

(10) Patent No.: US 12,158,695 B2
(45) Date of Patent: Dec. 3, 2024

(54) LENS DRIVING MODULE

(71) Applicant: Changzhou AAC Raytech Optronics Co., Ltd., Changzhou (CN)

(72) Inventors: Feng Yan, Shenzhen (CN); Tianheng Ni, Shenzhen (CN); Suohe Wei, Shenzhen (CN)

(73) Assignee: Changzhou AAC Raytech Optronics Co., Ltd., Changzhou (CN)

( * ) Notice: Subject to any disclaimer, the term of this patent is extended or adjusted under 35 U.S.C. 154(b) by 530 days.

(21) Appl. No.: 17/558,616

(22) Filed: Dec. 22, 2021

(65) Prior Publication Data

US 2022/0206363 A1 Jun. 30, 2022

(30) Foreign Application Priority Data

Dec. 30, 2020 (CN) .......................... 202011596824.1

(51) Int. Cl.
*G03B 5/00* (2021.01)
*H05K 1/18* (2006.01)

(52) U.S. Cl.
CPC ............... *G03B 5/00* (2013.01); *H05K 1/189* (2013.01); *G03B 2205/0076* (2013.01); *H05K 2201/10121* (2013.01)

(58) Field of Classification Search
CPC ......... H05K 1/189; H05K 2201/10121; G03B 2205/0076; G03B 30/00; G03B 2205/0015; G03B 5/00; G03B 13/36; G03B 13/32; G03B 2205/0007; G03B 2205/0053; G03B 3/10; G02B 7/09; G02B 7/08; G02B 7/28; G02B 27/646; H04N 23/68; H04N 23/682; H04N 23/685; H04N 23/687; F03G 7/065; F03G 7/0614; F03G 7/06143; F03G 7/06145
USPC .......................................................... 359/822
See application file for complete search history.

(56) References Cited

U.S. PATENT DOCUMENTS

2020/0192187 A1* 6/2020 Lee .................... H02K 41/0354

FOREIGN PATENT DOCUMENTS

CN     111812911 A   *   10/2020  ............... G03B 5/08
CN     111929971 A   *   11/2020

* cited by examiner

*Primary Examiner* — Pinping Sun
*Assistant Examiner* — Alaina Marie Swanson
(74) *Attorney, Agent, or Firm* — W&G Law Group

(57) ABSTRACT

A lens driving module includes first and second bases, a bottom base, a reset assembly, a PCB, first and second driving assemblies respectively driving first base to rotate about a first axis and second base to rotate about a second axis, and a lens mounted on the first base. The reset assembly includes reset members provided at two opposite sides of the bottom base along the first axis or the second axis. Each reset member includes first to third connection portions, a first elastic arm connected between first and second connection portions and configured to reset the first base, and a second elastic arm connected between second and third connection portions and configured to reset the second base. The first to third connection portions are respectively connected to first and second bases and bottom base, respectively. The lens driving module has a simplified structure, compact size, and improved stability.

8 Claims, 12 Drawing Sheets

LENS DRIVING MODULE

TECHNICAL FIELD

The present disclosure relates to the field of optical imaging technologies, and in particular, to a lens driving module.

BACKGROUND

With the continuous development of smart device technologies, lens driving modules with camera shooting functions have become indispensable parts for smart phones and tablets. How to achieve the optical image stabilization function of smart devices becomes very important. The lens driving modules in the related art generally drive the lens through shape memory alloy (SMA) wires, and are reset by reset members. However, the wiring of the reset members and the shape memory alloy wires in the related art is complicated. Meanwhile, since a pulling force of a flexible printed circuit (FPC) may affect the function of mechanisms when the FPC is electrically connected to the SMA terminal, the FPC needs to lengthen its circuit as much as possible. For example, the terminal is extended to and is electrically connected to the FPC, eventually it lead to a complicated manufacturing process of the lens driving module, so that the product structure is complex but not compact, and the various components of the lens driving module have a greater uncertainty when moving.

Therefore, it is necessary to provide a new technical solution to solve the above technical problems of the lens driving module.

SUMMARY

An objective of the present disclosure is to provide a lens driving module which can solve the problems of complex structure, a larger uncertainty during operation, and stabilization of various components of the lens driving module in the related art.

An aspect of the present disclosure provides a lens driving module. The lens driving module includes a lens, a first base, a second base, a bottom base, a first driving assembly, a second driving assembly, a reset assembly, and a printed circuit board. The lens is mounted on the first base, the first base is rotatably mounted on the second base about a first axis, the second base is rotatably mounted on the bottom base about a second axis, and the first axis and the second axis are perpendicular to each other and are perpendicular to an optical axis of the lens. The first driving assembly is configured to drive the first base to rotate about the first axis, and the second driving assembly is configured to drive the second base to rotate about the second axis. The reset assembly includes reset members provided at two opposite sides of the bottom base along the first axis or the second axis, each of the reset member includes a first connection portion, a second connection portion, a third connection portion, a first elastic arm connected between the first connection portion and the second connection portion, and a second elastic arm connected between the second connection portion and the third connection portion, the first connection portion is connected to the first base, the second connection portion is connected to the second base, the third connection portion is connected to the bottom base, the first elastic arm is configured to reset the first base, and the second elastic arm is configured to reset the second base.

As an improvement, the first elastic arm has a U-shaped structure, and the U-shaped structure has two ends respectively connected to the first connection portion and the second connection portion and an opening facing towards a direction perpendicular to the optical axis; and the second elastic arm has a wave-shaped structure, and the wave-shaped structure has two ends respectively connected to the second connection portion and the third connection portion.

As an improvement, the first connection portion, the second connection portion, the third connection portion, the first elastic arm, and the second elastic arm of each of the reset members are formed into one piece.

As an improvement, two of the reset members are arranged at each of sides of the bottom base, and two of the reset members at one of the sides of the bottom base are symmetrical to each other with respect to the optical axis.

As an improvement, the first driving assembly includes at least one first shape memory alloy wire configured to connect the first base with the second base; the second driving assembly includes at least one second shape memory alloy wire configured to connect the second base with the bottom base; and the at least one first shape memory alloy wire or the at least one second shape memory alloy wire are electrically connected to the printed circuit board through the reset members.

As an improvement, the at least one first shape memory alloy wire is electrically connected to the printed circuit board through at least one of the reset members; each of the at least one first shape memory alloy wire includes a first fixation end, a second fixation end, a third fixation end, a first extension section connected between the first fixation end and the second fixation end, and a second extension section connected between the second fixation end and the third fixation end. The first fixation end is connected to the second base and electrically connected to one of the second connection portions of the reset members that is located at a same side as the first fixation end, the second fixation end is connected to the first base, and the third fixation end is connected to the second base and electrically connected to another second connection portion of the second connection portions of the reset members that is located at a same side as the third fixation end. The second elastic arm has a wave-shaped structure, and the wave-shaped structure has two ends respectively connected to the second connection portion and the third connection portion. Each of the at least one second shape memory alloy wire includes a fourth fixation end, a fifth fixation end, a sixth fixation end, a third extension section connected between the fourth fixation end and the fifth fixation end, and a fourth extension section connected between the fifth fixation end and the sixth fixation end. The fourth fixation end is connected to the bottom base and electrically connected to the printed circuit board, the fifth fixation end is connected to the second base, and the sixth fixation ends is connected to the bottom base and electrically connected to the printed circuit board.

As an improvement, the at least one first shape memory alloy wires includes at least two first shape memory alloy wires, the at least one second shape memory alloy wire includes at least two second shape memory alloy wires. The second fixation ends of the at least two first shape memory alloy wires provided at two opposite sides of the bottom base are provided at two sides of the first axis along the first axis, and the fifth fixation ends of the at least two second shape memory alloy wires provided at another two opposite sides of the bottom base are provided at two sides of the second axis along the second axis.

As an improvement, the lens driving module further includes a first rolling assembly sandwiched between the first base and the second base and arranged along the first axis, and a second rolling assembly sandwiched between the second base and the bottom base and arranged along the second axis.

As an improvement, the first rolling assembly includes two first rolling balls, the second base is provided with two first grooves for respectively accommodating the two first rolling balls, and a surface of the first base facing towards the two first rolling balls is concavely provided with first concave spherical surfaces for respectively abutting against the two first rolling balls. The second rolling assembly includes two second rolling balls, the bottom base is provided with two second grooves for respectively accommodating the two second rolling balls, and a surface of the second base facing towards the two second rolling balls is concavely provided with second concave spherical surfaces for respectively abutting against the two second rolling balls.

As an improvement, two opposite sides of the first base that are arranged along the first axis are convexly provided with two first protruding posts for connecting the second fixation ends, and the two first protruding posts are respectively provided at two sides of the first axis. Each of the two first protruding posts is provided with a first blocking plate that prevents one of the second fixation ends from dropping from one of the two first protruding posts. Two opposite sides of the second base that are arranged along the second axis are convexly provided with two fifth protruding posts for connecting the fifth fixation ends, and the two fifth protruding posts are respectively provided at two sides of the second axis. Each of the two fifth protruding posts is provided with a second blocking plate that prevents one of the fifth fixation ends from dropping from one of the two fifth protruding posts.

The beneficial effects of the present disclosure are as follows.

Compared with the related art, in the lens driving module provided by the embodiments of the present disclosure, the reset assembly includes reset members provided at two opposite sides of the bottom base along the first axis or the second axis, and each of the reset members includes a first elastic arm and a second elastic arm. The first elastic arm is connected to the first base through the first connection portion, and the first elastic arm can provide a restoring force when the first base rotates about the first axis. The second elastic arm is connected to the second base through the second connection portion, and the second elastic arm can provide a restoring force when the second base rotates about the second axis, so that the lens driving module has a restoring function in two crossing directions. More importantly, only reset members can be provided on two opposite sides of the bottom base to achieve the reset function of the lens drive module in two rotation directions, which is beneficial to simplify the structure of the lens drive module and improve the compactness, thereby improving the stability of the various components of the lens driving module when moving.

DESCRIPTION OF REFERENCE NUMERALS

Figure 1:
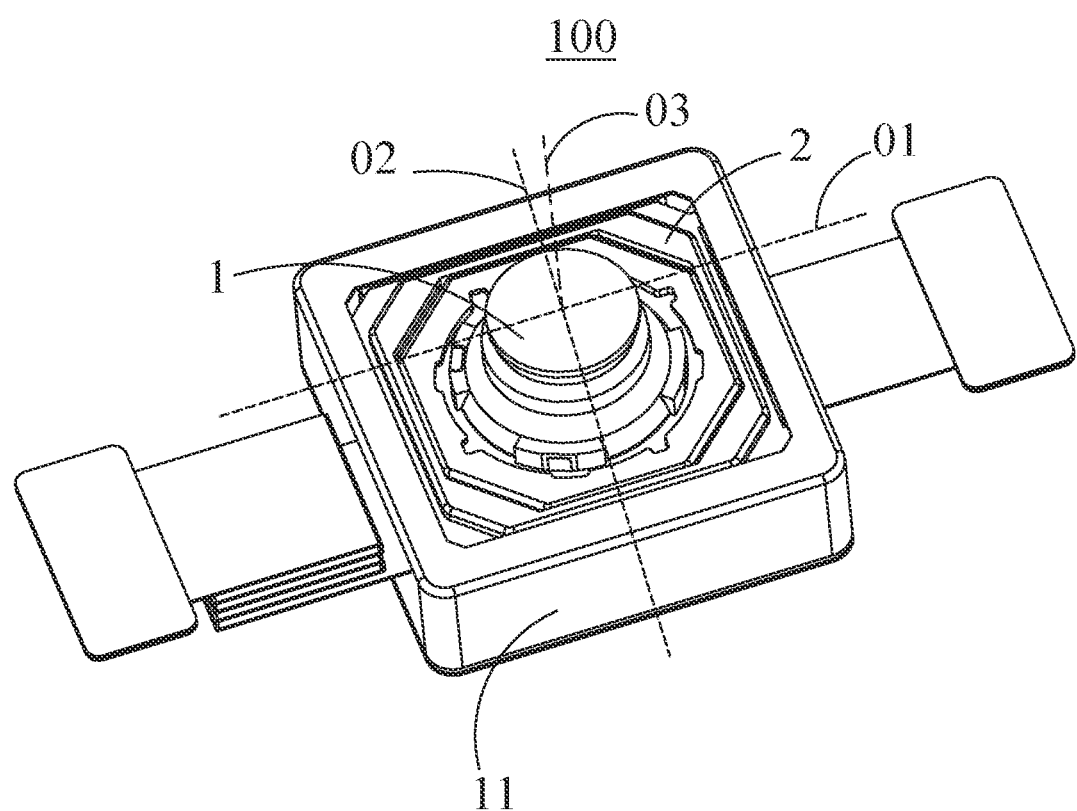
FIG. 1 is a three-dimensional schematic diagram showing a lens driving module according to Embodiment 1 of the present disclosure.

100: lens driving module;
1: lens;
2: first base;
21: first concave spherical surface; 22: first protruding post; 221: first blocking plate; 23: second protruding post;
3: second base;
30: first mounting portion; 31: first groove; 32: second concave spherical surface; 33: third protruding post; 34: fifth protruding post; 341: second blocking plate;
4: bottom base;
40: second mounting portion; 41: second groove; 42: fourth protruding post;
5: first driving assembly;
51: first shape memory alloy wire; 511: first fixation end; 512: second fixation end; 513: third fixation end; 514: first extension section; 515: second extension section;
6: second driving assembly;

61: second shape memory alloy wire; 611: fourth fixation end; 612: fifth fixation end; 613: sixth fixation end; 614: third extension section; 615: fourth extension section;
7: reset assembly;
71: reset member; 711: first connection portion; 712: second connection portion; 713: third connection portion; 714: first elastic arm; 715: second elastic arm;
8: printed circuit board;
81: first terminal; 82: second terminal; 83: third terminal; 84: fourth terminal;
9: first rolling assembly;
91: first rolling ball;
10: second rolling assembly;
101: second rolling ball;
11: housing;
111: main shell; 1111: through hole; 112: bottom plate;
01: first axis; 02: second axis; 03: optical axis;
001: accommodating cavity; 011: opening.

DESCRIPTION OF EMBODIMENTS

The embodiments of the present disclosure are described in details with reference to the drawings. It should be clear that the described embodiments are merely part of the embodiments of the present disclosure rather than all of the embodiments. All other embodiments obtained by those skilled in the art shall fall into the protection scope of the present disclosure.

It should be noted that all directional indication (e.g., up, down, left, right, front, back, etc.) in the embodiments of the present disclosure are only used to explain the relative positional relationship and movement of the parts at a specific situation. If the specific situation changes, the directional indication changes accordingly.

It should also be noted that when an element is referred to as being "fixed on" or "provided on" another element, it can be directly on the other element or there may be a centering element simultaneously. When an element is said to be "connect" to another element, it can be directly connected to the other element or there may be a centering element simultaneously.

The terms "first" or "second" in the present disclosure are only used for descriptive purposes, and cannot be understood as indicating or implying their relative importance or implicitly indicating the number of technical features. Therefore, the features defined with "first" and "second" may explicitly or implicitly include at least one of the features. In addition, the technical solutions in the various embodiments can be combined with each other, but it can be achieved by those skilled in the art. When the combination of technical solutions is contradictory or cannot be achieved, it should be considered that such a combination of technical solutions does not exist, and it does not fall within the protection scope of the present disclosure.

Embodiment 1

FIG. 1 to FIG. 15 are schematic diagrams showing a lens driving module 100 and its components according to Embodiment 1.

Referring to FIG. 1 to FIG. 7, the lens driving module 100 includes a lens 1, a first base 2, a second base 3, a bottom base 4, a first driving assembly 5, a second driving assembly 6, a reset assembly 7, a printed circuit board 8, a first rolling assembly 9, a second rolling assembly 10, and a housing 11. The housing 11 has an accommodating cavity 001 provided with an opening 011. The first base 2, the second base 3, the bottom base 4, the first driving assembly 5, the second driving assembly 6, and the reset assembly 7 are all accommodated in the accommodating cavity 001. The lens 1 is mounted on the first base 2 and extends through the opening 011 to the outside of the housing 11. The printed circuit board 8 is partially accommodated in the accommodating cavity 001 and partially extends from the accommodating cavity 001 to the outside of the housing 11, thereby achieving electrical connection to an external power supply.

The lens driving module 100 has a first axis 01 and a second axis 02. The lens 1 has an optical axis 03. The first axis 01 and the second axis 02 are perpendicular to each other and are perpendicular to the optical axis 03. The first base 2 is rotatably mounted on the second base 3 about the first axis 01. The second base 3 is rotatably mounted on the bottom base 4 about the second axis 02. The first driving assembly 5 is configured to drive the first base 2 to rotate about the first axis 01. The second driving assembly 6 is configured to drive the second base 3 to rotate about the second axis 02. The reset assembly 7 includes reset members 71 provided at two opposite sides of the bottom base 4 along the first axis 01. Details can be referred to FIG. 7. Each reset member 71 includes a first connection portion 711, a second connection portion 712, a third connection portion 713, a first elastic arm 714, and a second elastic arm 715. The connection portion 711 is connected to the first base 2. The second connection portion 712 is connected to the second base 3. The third connection portion 713 is connected to the bottom base 4. The first elastic arm 714 is configured to connect the first connection portion 711 with the second connection portion 712 and to reset the first base 2. The second elastic arm 715 is configured to connect the second connection portion 712 with the third connection portion 713 and to reset the second base 3.

In practical applications, the first elastic arm 714 has a U-shaped structure. The U-shaped structure has two ends respectively connected to the first connection portion 711 and the second connection portion 712, and an opening facing towards a direction perpendicular to the optical axis 03. The second elastic arm 715 has a wave-shaped structure. The wave-shaped structure has two ends respectively connected to the second connection portion 712 and the third connection portion 713. In some embodiments, the wave-shaped structure is formed by twisting and bending the second elastic arm 715 in a direction parallel to the optical axis 03. In an embodiment of the present disclosure, the first connection portion 711, the second connection portion 712, the third connection portion 713, the first elastic arm 714, and the second elastic arm 715 of each of the reset members 71 are formed into one piece. In some embodiments, the reset member 71 can also adopt a split type design. For example, the second connection portion 712 is formed by two separate connection portions, one of which is connected to the first connection portion 711 by the first elastic arm 714, and the other one of which is connected to the third connection portion 713 by the second elastic arm 715. In some embodiments, each side of the two opposite sides of the bottom base 4 along the first axis 01 is provided with two reset members 71. Two reset members 71 at a same side of the bottom base 4 are symmetrical with respect to the optical axis 03, and the reset members 71 at two sides are centrally symmetrical about the optical axis 03.

Figure 2:
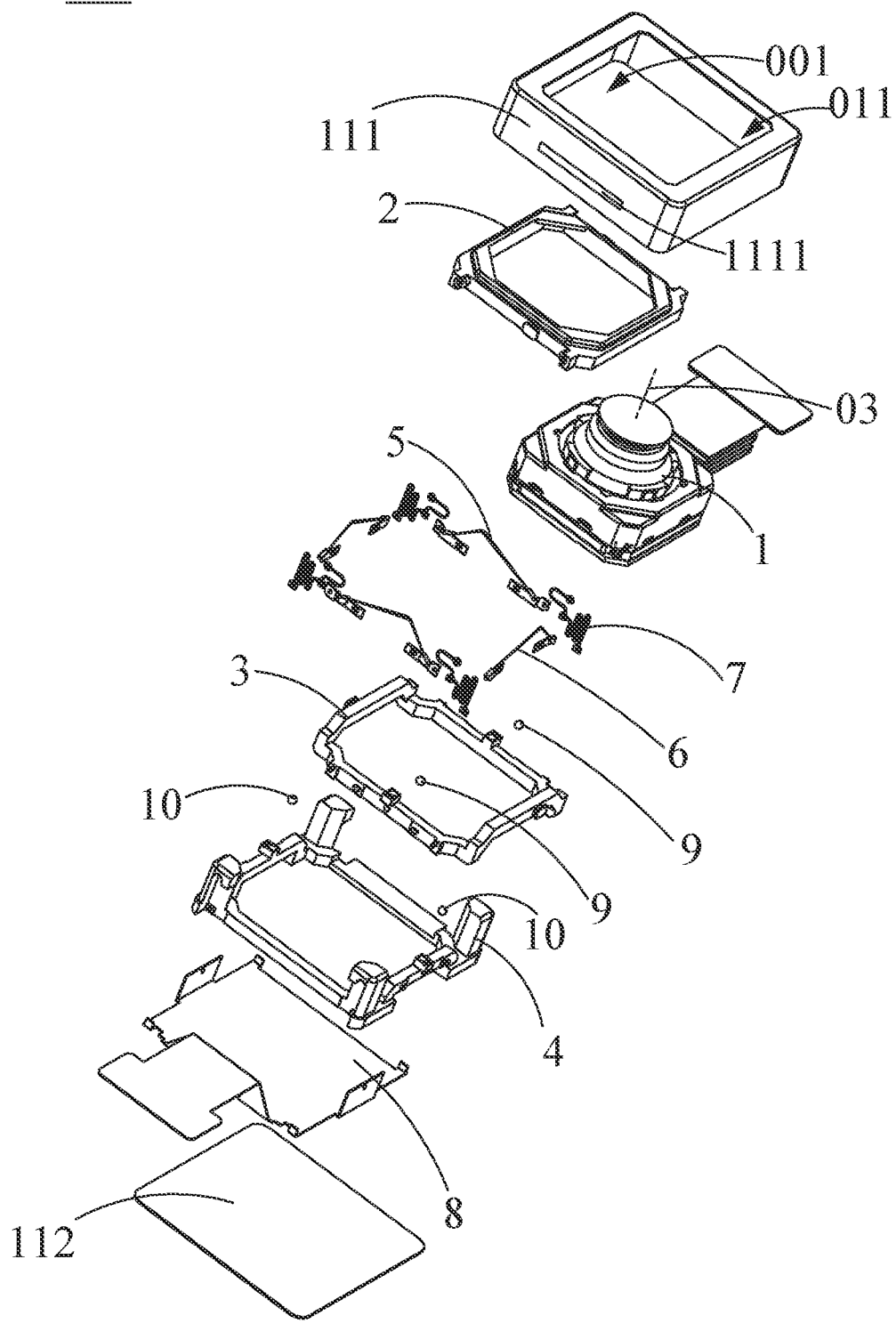
FIG. 2 is a exploded schematic diagram showing the lens driving module of FIG. 1 according to an embodiment of the present disclosure.
Figure 3:
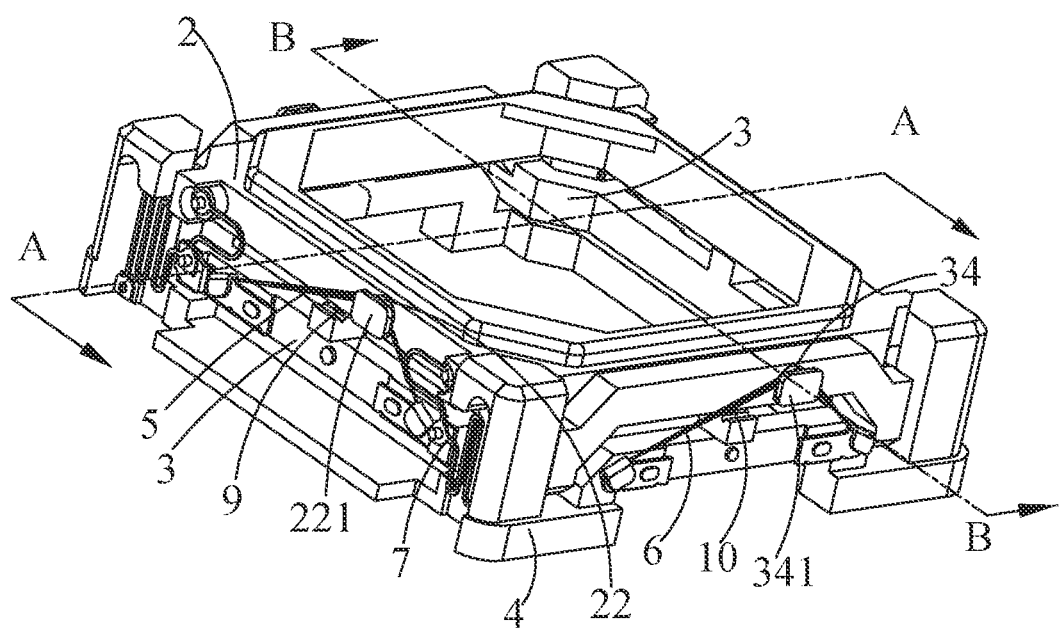
FIG. 3 is a three-dimensional schematic diagram showing the lens driving module of FIG. 1 after a housing, a lens, and a printed circuit board are removed according to an embodiment of the present disclosure.
Figure 4:
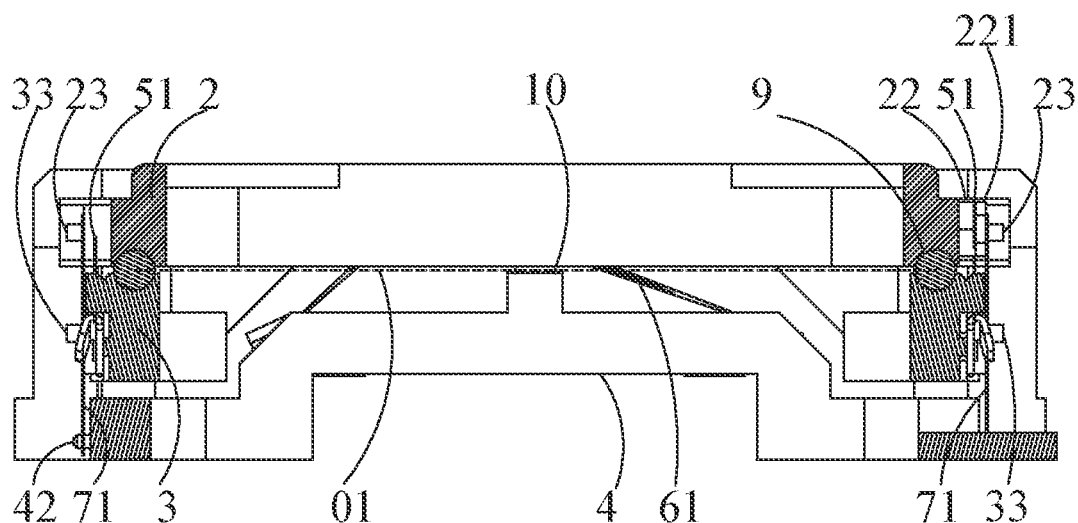
FIG. 4 is a cross-sectional view along line A-A shown in FIG. 3 according to an embodiment of the present disclosure.
Figure 8:
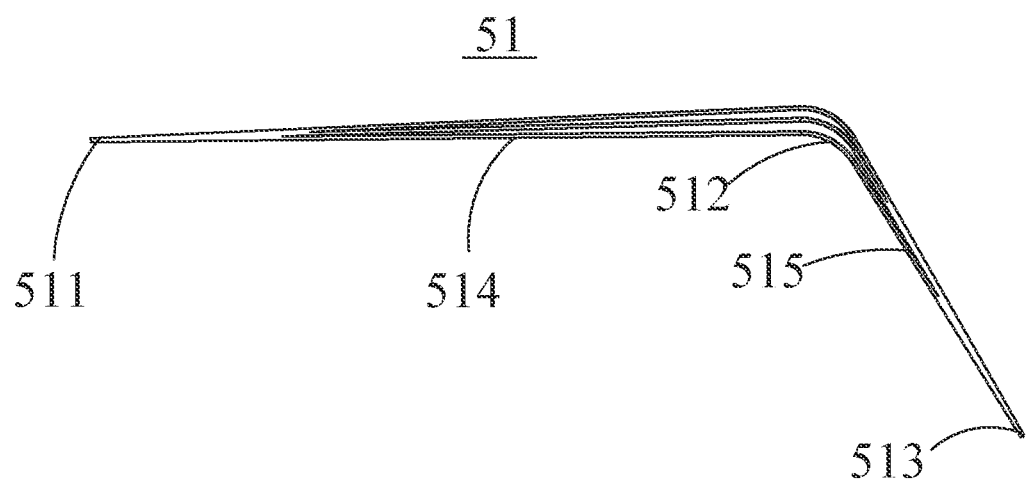
FIG. 8 is a three-dimensional schematic diagram showing a first shape memory alloy wire according to Embodiment 1 of the present disclosure.

Referring to FIG. 2, FIG. 4, and FIG. 8, the first driving assembly 5 includes two sets of first shape memory alloy wires 51 which are respectively provided at two opposite sides of the bottom base 4 along the first axis 01. Each first shape memory alloy wire 51 is connected to both the first base 2 and the second base 3, and each first shape memory alloy wire 51 is electrically connected to the reset members 71 that are located at a same side. The reset member 71 is electrically connected to the printed circuit board 8.

In practical applications, each first shape memory alloy wire 51 includes a first fixation end 511, a second fixation end 512, a third fixation end 513, a first extension section 514, and a second extension section 515. The first fixation end 511 is connected to the second base 3. The second fixation end 512 is connected to the first base 2. The third fixation end 513 is connected to the second base 3. The first extension section 514 is connected to the first fixation end 511, extends from the first fixation end 511 toward the first base 2, and is connected to the second fixation end 512. The second extension section 515 is connected to the second fixation end 512, extends from the second fixation end 512 toward the second base 3, and is connected to the third fixation end 513. The first fixation end 511 is electrically connected to one second connection portion 712, the third fixation end 513 is electrically connected to another second connection portion 712, and the one second connection portion 712 and another second connection portion 712 are located at a same side, thereby achieving the electrical connection between the first shape memory alloy wire 51 and the printed circuit board 8.

In some embodiments, the second fixation ends 512 provided at two opposite sides of the bottom base 4 are provided at two sides of the first axis 01 along the first axis 01, that is, the second fixation end 512 of one of the first shape memory alloy wires 51 and the second fixation end 512 of the another one of the first shape memory alloy wires 51 are provided at two opposite sides of the bottom base 4 along the first axis 01, and are centrally symmetrical with respect to the optical axis 03, thereby providing driving force for the first base 2 to rotate about the first axis 01 from two opposite sides of the first base 2 along the first axis 01.

In some embodiments, the reset member 71 is used as an electrical connection medium between the printed circuit board 8 and the first shape memory alloy wire 51, so that a circuit loop mutually conducted between the first shape memory alloy wire 51 and the printed circuit board 8 can be effectively shortened, and thus there is no need to worry about complicated circuits when the components of the lens driving module 100 move, thereby achieving a higher stability when moving. Therefore, the lens driving module 100 can be designed more compactly and have a relative small size, which is beneficial to the miniaturization of the lens driving module 100 while the manufacturing process of the lens driving module 100 becomes relatively simple.

Figure 5:
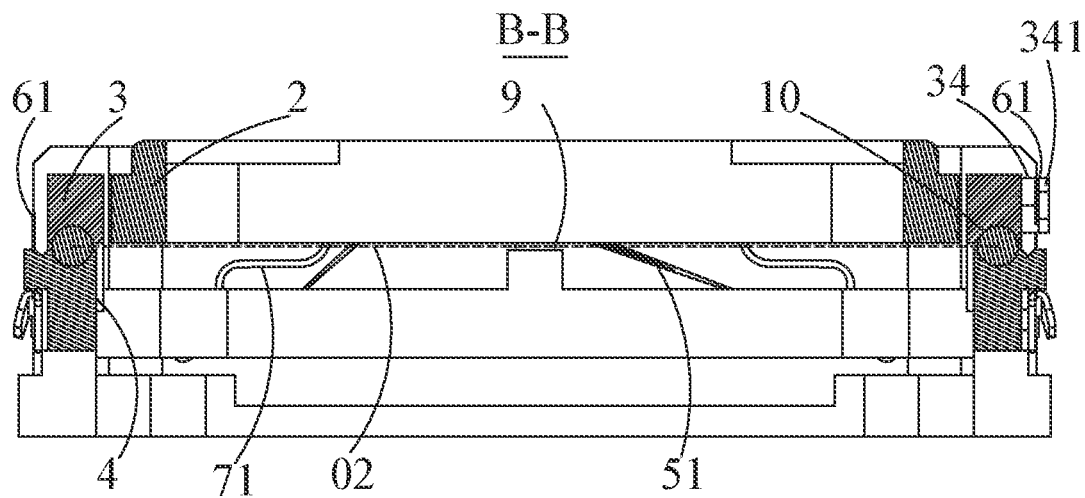
FIG. 5 is a cross-sectional view along line B-B shown in FIG. 3 according to an embodiment of the present disclosure.
Figure 6:
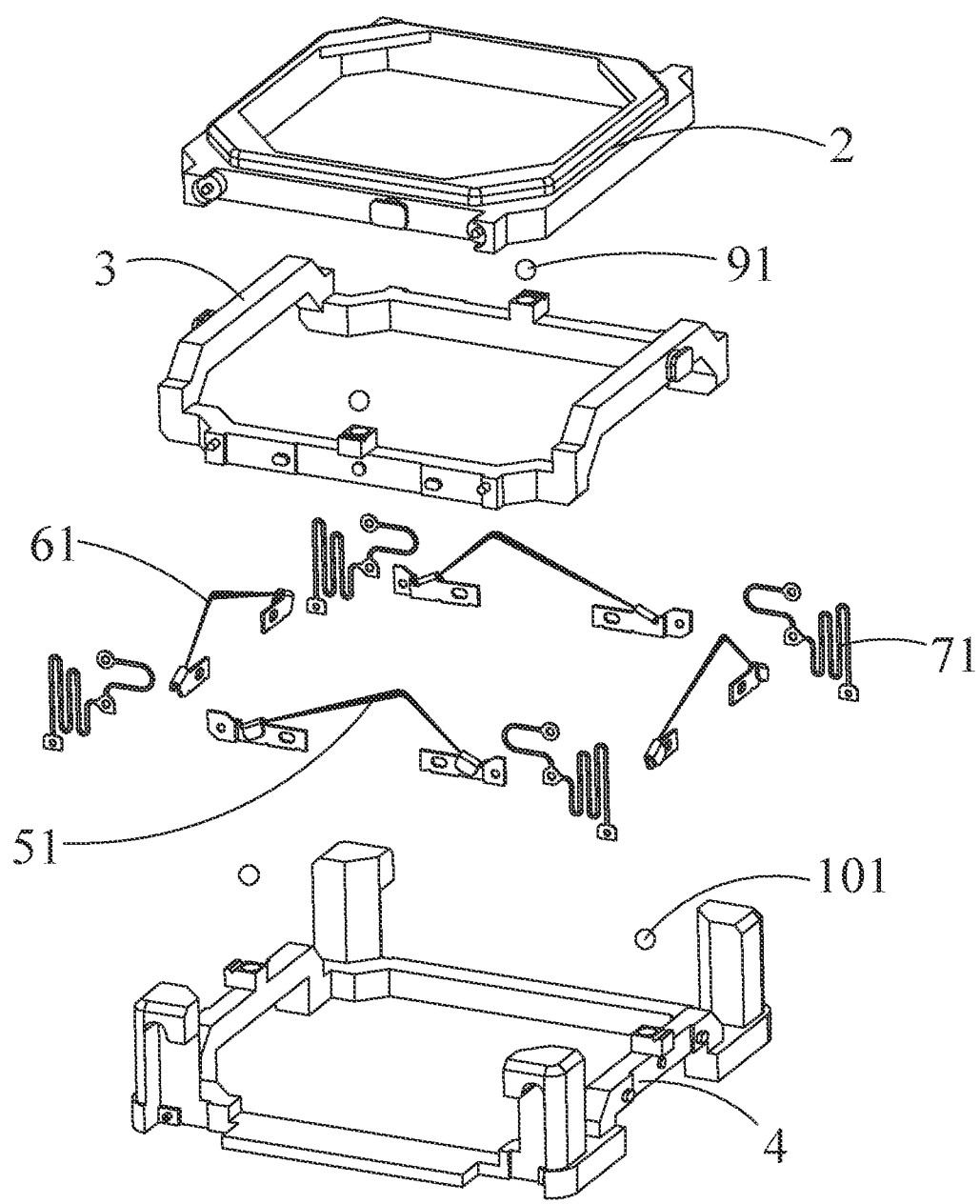
FIG. 6 is a exploded schematic diagram corresponding to FIG. 3 according to an embodiment of the present disclosure.
Figure 7:
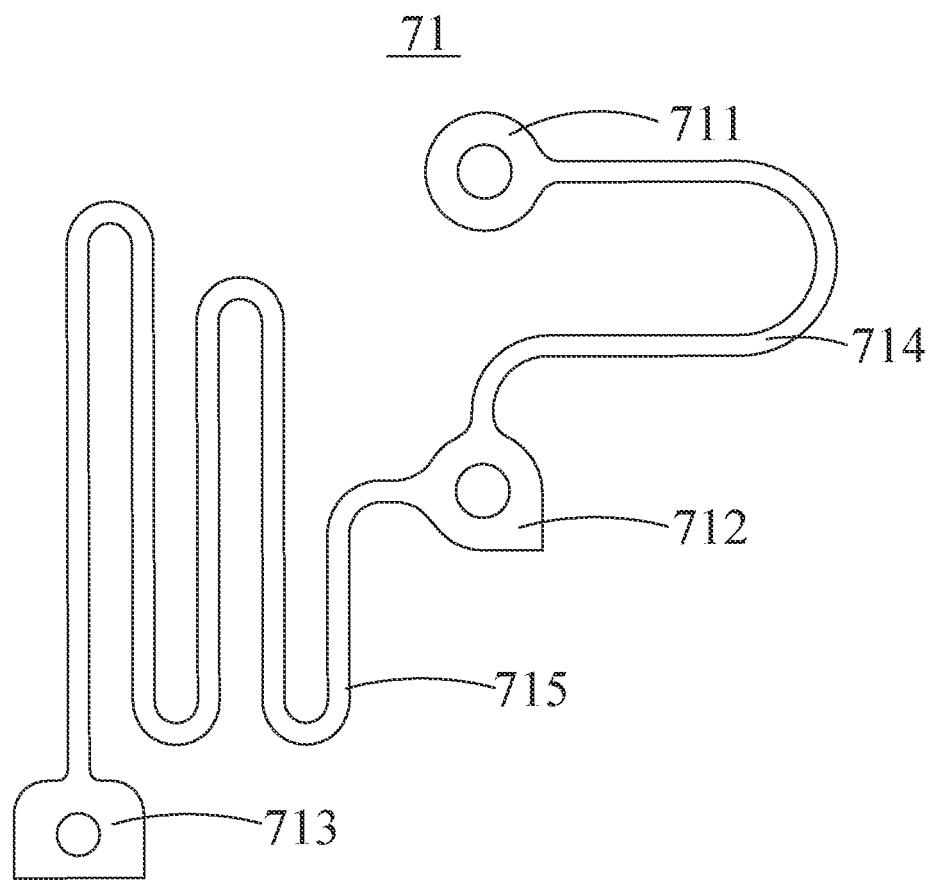
FIG. 7 is a three-dimensional schematic diagram showing a reset member according to Embodiment 1 of the present disclosure.
Figure 9:
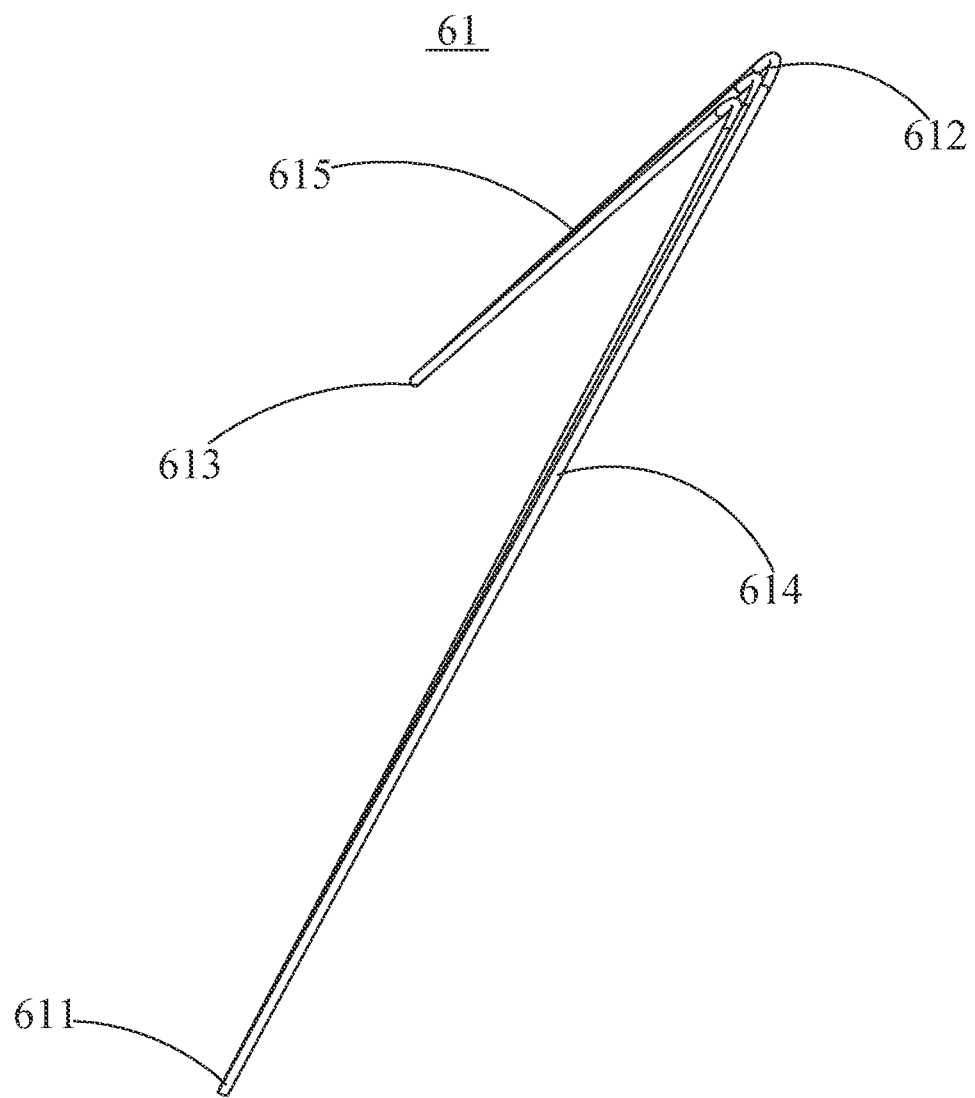
FIG. 9 is a three-dimensional schematic diagram showing a second shape memory alloy wire according to Embodiment 1 of the present disclosure.
Figure 10:
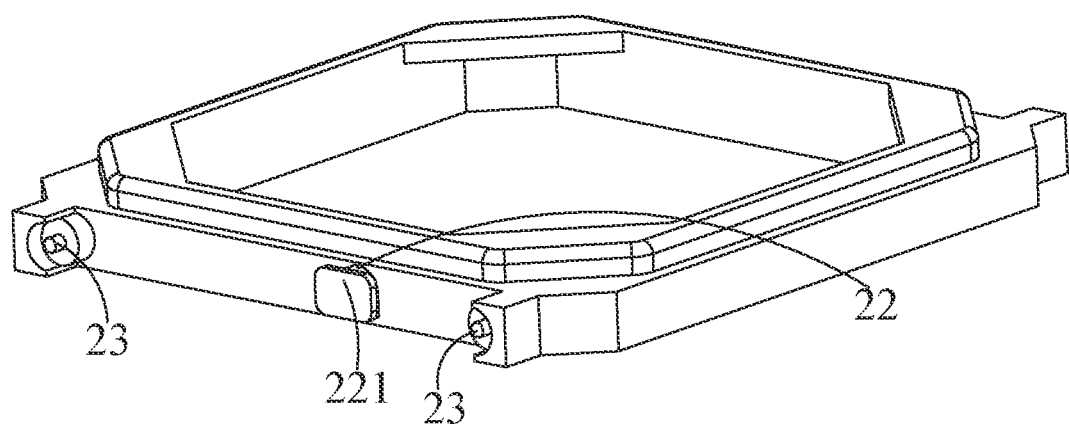
FIG. 10 is a three-dimensional schematic diagram showing a first base according to Embodiment 1 of the present disclosure.
Figure 11:
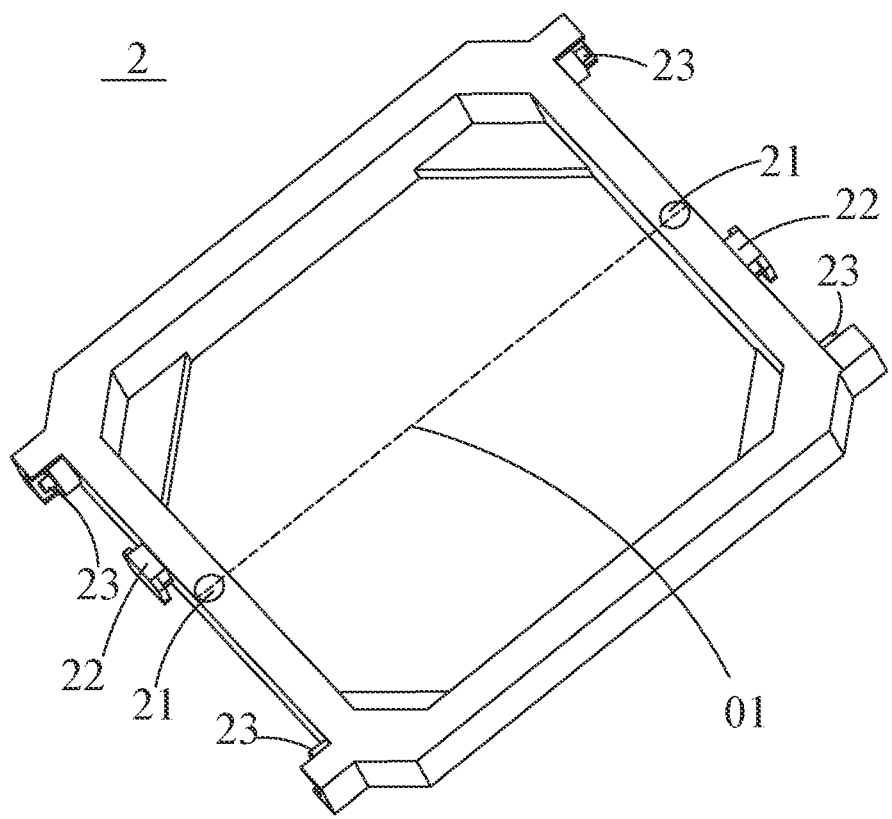
FIG. 11 is a three-dimensional schematic diagram showing the first base from another perspective according to the Embodiment 1 of the present disclosure.
Figure 12:
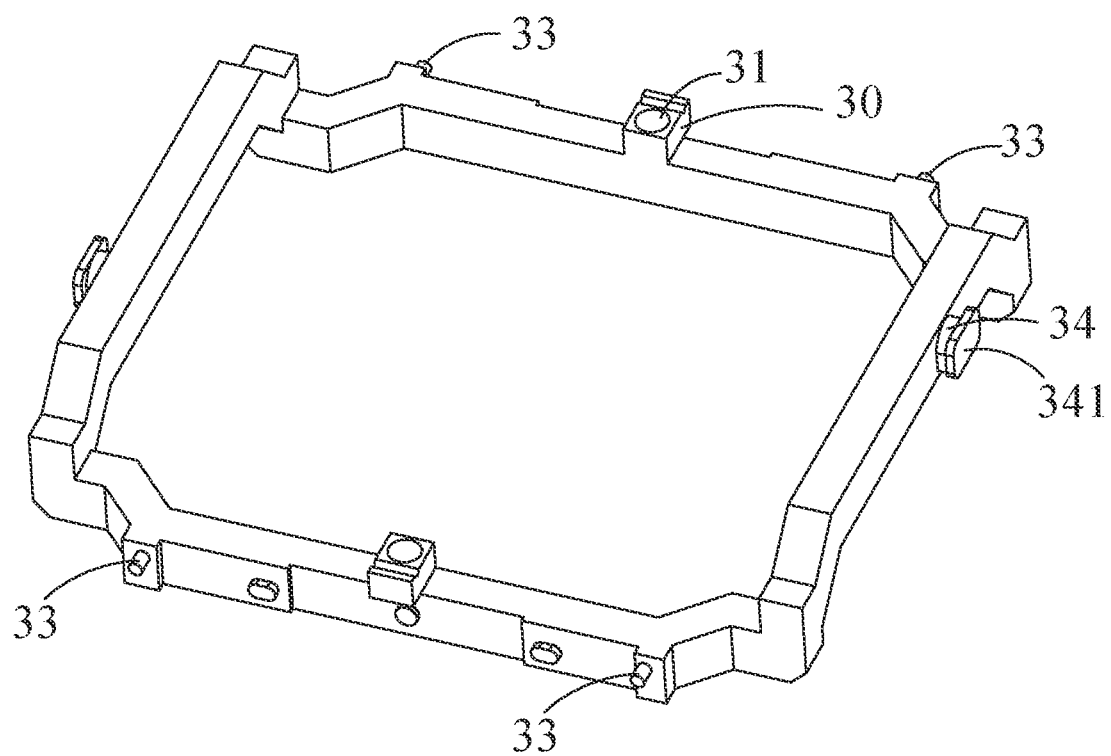
FIG. 12 is a three-dimensional schematic diagram showing a second base according to Embodiment 1 of the present disclosure.
Figure 13:
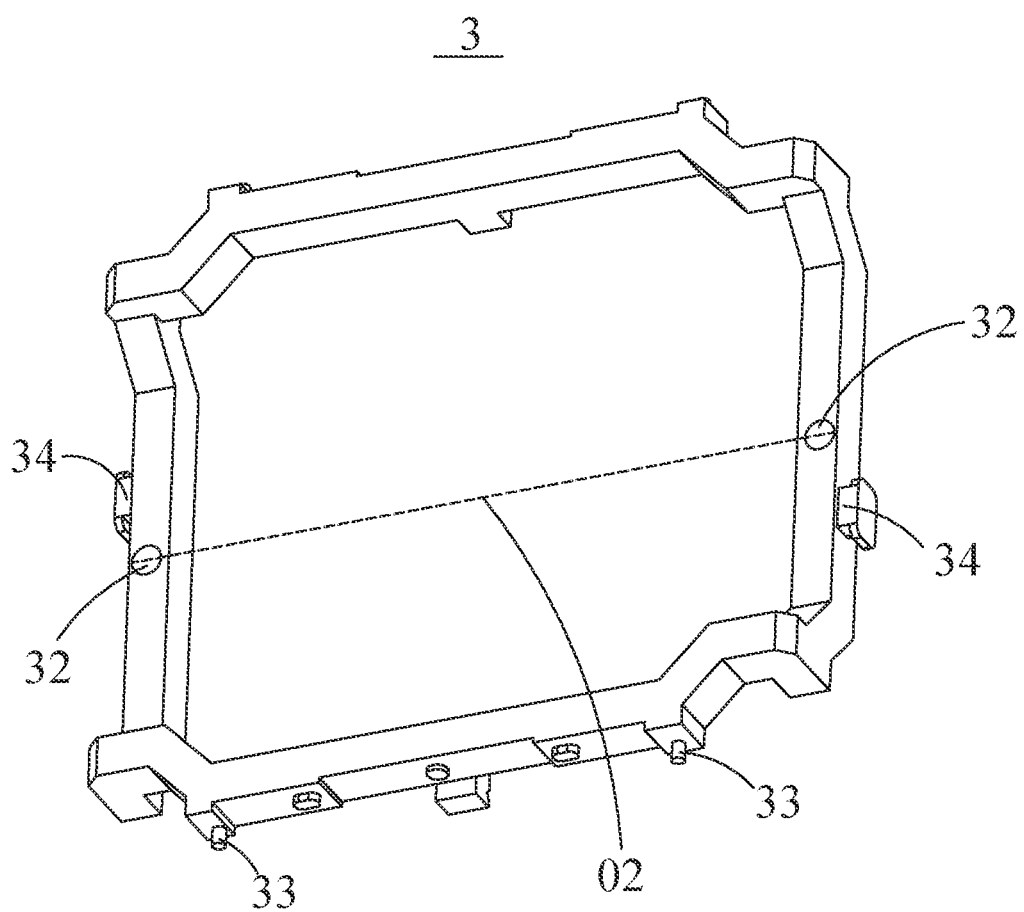
FIG. 13 is a three-dimensional schematic diagram showing the second base from another perspective according to Embodiment 1 of the present disclosure.
Figure 14:
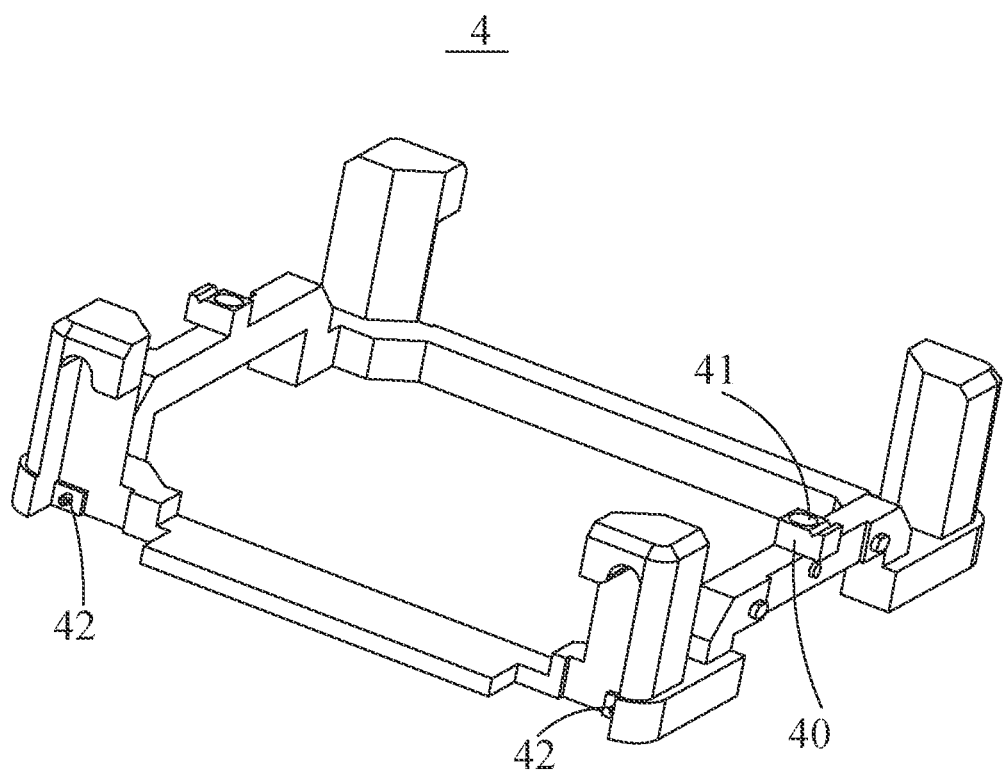
FIG. 14 is a three-dimensional schematic diagram showing a bottom base according to Embodiment 1 of the present disclosure.
Figure 15:
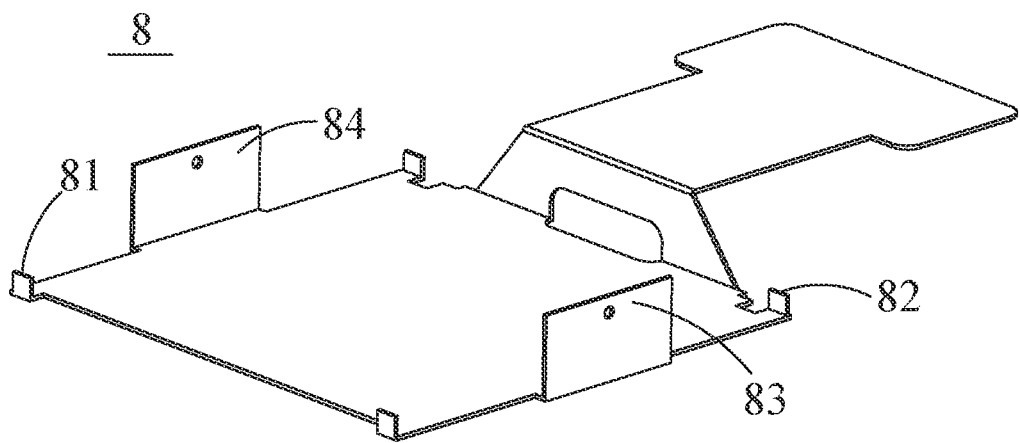
FIG. 15 is a three-dimensional schematic diagram showing a printed circuit board according to Embodiment 1 of the present disclosure.
Figure 16:
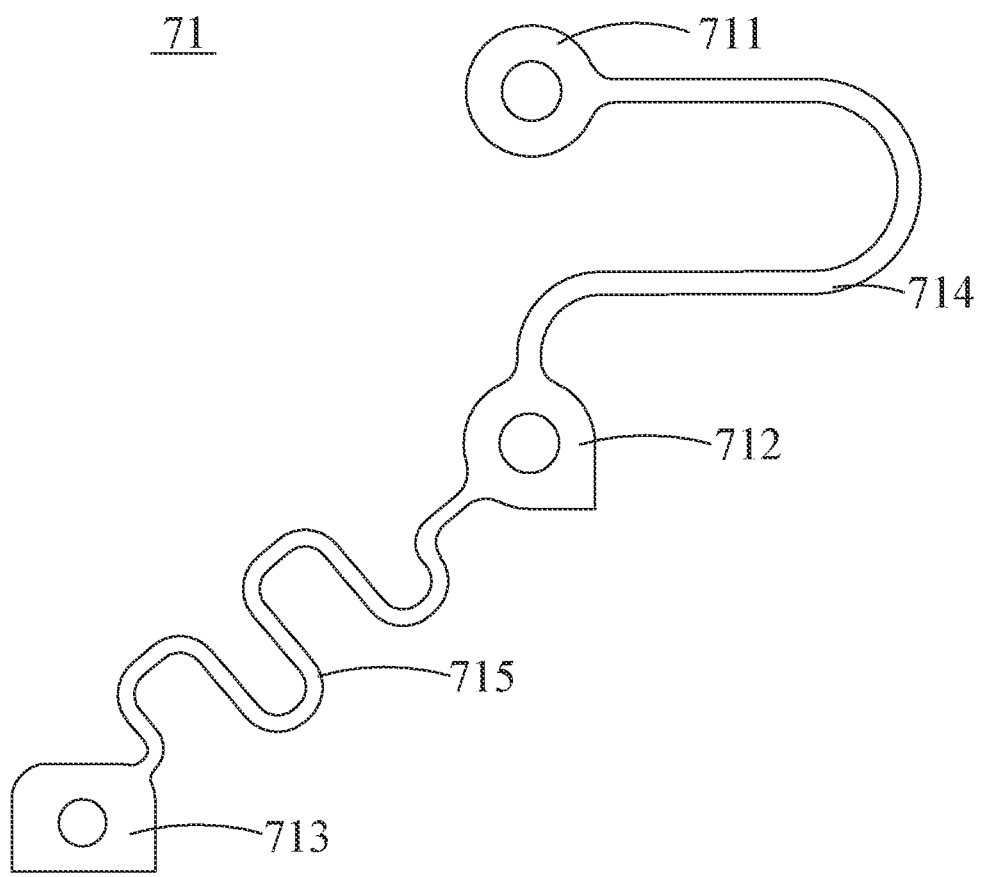
FIG. 16 is a three-dimensional schematic diagram showing a reset member according to Embodiment 2 of the present disclosure.

Referring to FIG. 2, FIG. 5, and FIG. 9, the second driving assembly 6 includes two sets of second shape memory alloy wires 61, and the two sets of second shape memory alloy wires 61 are respectively provided at two opposite sides of the bottom base 4 along the second axis 02. Each second shape memory alloy wire 61 is connected to the second base 3 and the bottom base 4, and is electrically connected to the printed circuit board 8 at a same side as the second shape memory alloy wire 61.

In practical applications, each second shape memory alloy wire 61 includes a fourth fixation end 611, a fifth fixation end 612, a sixth fixation end 613, a third extension section 614, and a fourth extension section 615. The fourth fixation end 611 is connected to the bottom base 4. The fifth fixation end 612 is connected to the second base 3. The sixth fixation end 613 is connected to the bottom base 4. The third extension section 614 is connected to the fourth fixation end 611, extends from the fourth fixation end 611 toward the second base 3, and is connected to the fifth fixation end 612. The fourth extension section 615 is connected to the fifth fixation end 612, extends from the fifth fixation ends 612 toward the bottom base 4, and is connected to the sixth fixation ends 613. The fourth fixation end 611 and the sixth fixation ends 613 are electrically connected to the printed circuit board 8.

In some embodiments, the fifth fixation ends 612 provided at two opposite sides of the bottom base 4 are provided at two sides of the second axis 02 along the second axis 02, that is, the fifth fixation end 612 of one second shape memory alloy wire 61 and the fifth fixation end 612 of the other second shape memory alloy wire 61 are provided at two opposite sides of the bottom base 4 along the second axis 02, and are centrally symmetrical with respect to the optical axis 03, thereby applying driving force to drive the second base 3 to rotate about the second axis 02 from two opposite sides of the second base 3 along the second axis 02.

Referring to FIG. 4, FIG. 5, FIG. 6, FIG. 11, FIG. 12, FIG. 13, and FIG. 14, the first rolling assembly 9 is sandwiched between the first base 2 and the second base 3 and is arranged along the first axis 01, so that the first base 2 can rotate about the first axis 01. The second rolling assembly 10 is sandwiched between the second base 3 and the bottom base 4 and is arranged along the second axis 02, so that the second base 3 can rotate about the second axis 02.

In practical applications, the first rolling assembly 9 includes two first rolling balls 91. A line connecting centers of the two first rolling balls 91 is the first axis 01. Two first grooves 31 are provided on the second base 3, and are arranged along the first axis 01. Each first groove 31 is configured to accommodate one first rolling ball 91. A surface of the first base 2 facing toward the first rolling ball 91 is concavely provided with a first concave spherical surface 21, so that the first base 2 abuts against the first rolling ball 91 to make the first base 2 able to rotate about the first axis 01. The second rolling assembly 10 includes two second rolling balls 101. A line connecting centers of the two second rolling balls 101 is the second axis 02. Two second grooves 41 are provided on the second base 4, and are arranged along the second axis 02. Each second groove 41 is configured to accommodate one second rolling ball 101. A surface of the second base 3 facing toward the second rolling ball 101 is concavely provided with a second concave spherical surface 32, so that the second base 3 abuts against the second rolling ball 101 to make the second base 3 able to rotate about the second axis 02.

In some embodiments, a surface of the second base 3 facing toward the first base 2 can be convexly provided with two first mounting portions 30 which are arranged along the first axis 01. Each first mounting portion 30 can be provided with a first groove 31. With the first mounting portion 30, the first base 2 has a larger rotation amplitude when rotating about the first axis 01, thereby avoiding collision between an end of the first base 2 and the second base 3. A surface of the bottom base 4 facing toward the second base 3 can be convexly provided with two second mounting portions 40 which are provided along the second axis 02. Each second mounting portion 40 can be provided with a second groove 41. With the second mounting portion 40, the second base 3 also has a larger rotation amplitude when rotating about the second axis 02, thereby avoiding collision between an end of the second base 3 and the bottom base 4. The configurations of the first mounting portion 30 and the second mounting portion 40 are beneficial to improve the stability of the components of the lens driving module 100 when moving.

Referring to FIG. 4, FIG. 5, FIG. 8, FIG. 10, FIG. 12, and FIG. 14, the first base 2 is convexly provided with first protruding posts 22 and second protruding posts 23. The number of the first protruding post 22 is two. The two first protruding posts are provided along two opposite sides of the first axis 01 and is configured to be connected to the second fixation end 512. Meanwhile, two first protrusion posts 22 are provided at two sides of the first axis 01. Two first protrusion posts 22 are provided at two sides of the first axis 01, so that the two first protrusion posts 22 are respectively connected to the second fixation ends 512 of the two first shape memory alloy wires 51, which facilitates applying a driving force to the first base 2 by the first shape memory alloy wires 51 located at two opposite sides. Each first protruding post 22 can be provided with a first blocking plate 221 configured to prevent the second fixation end 512 from dropping from the first protruding post 22. The first blocking plate 221 can effectively prevent the first shape memory alloy wire 51 from dropping during an operating process and then avoiding an accident to occur. The second protruding posts 23 are arranged along two opposite sides of the first axis 01 and configured to be connected to the first connection portion 711. The number of the second protruding posts 23 is four, that is, the first base 2 is provided with two second protruding posts 23 at each side of two opposite sides along the first axis 01, and two second protrusion posts 23 at a same side are symmetrical with respect to the optical axis 03.

The second base 3 is convexly provided with third protruding posts 33 and fifth protruding posts 34. The third protruding posts 33 are provided at two opposite sides of the first axis 01 and is configured to be connected to the second connection portion 712. The number of third protruding post 33 is four, that is, the second base 3 is provided with two third protruding posts 33 at each side of two opposite sides along the first axis 01, and two third protruding posts 33 at the same side are symmetrical with respect to the optical axis 03. The fifth protruding posts 34 are provided at two opposite sides of the second axis 02 so as to connect the fifth fixation ends 612. Meanwhile, two fifth protruding posts 34 are provided at two sides of the second axis 02. The two fifth protruding posts 34 are respectively provided at two sides of the second axis 02, so that the two fifth protruding posts 34 are respectively connected to the fifth fixation ends 612 of the two first shape memory alloy wires 61, thereby facilitating applying a driving force to the second base 3 by the second shape memory alloy wires 61 located at two opposite sides. The fifth protruding post 34 can be provided with a second blocking plate 341 and configured to prevent the fifth fixation end 612 from dropping from the fifth protruding post 34. The second blocking plate 341 can effectively prevent the second shape memory alloy wire 61 from dropping during an operating process and then avoiding an accident to occur.

The bottom base 4 is provided with fourth protruding posts 42 which are provided at two opposite sides of the bottom base 4 along the first axis 01, and the fourth protruding post 42 is configured to connect the third connection portion 713. The number of the fourth protruding posts 42 is four, that is, the bottom base 4 is provided with two fourth protruding posts 42 at each side of two opposite sides along the first axis 01, and the two fourth protruding posts 42 at the same side are symmetrically with respect to the optical axis 03.

Referring to FIG. 1, FIG. 2, FIG. 4, FIG. 5, and FIG. 15, the housing 11 includes a main shell 111 and a bottom plate 112. The main shell 111 and the bottom plate 112 enclose to form an accommodating cavity 001. The main shell 111 is provided with an opening 011. A through hole 1111 is provided at a side wall of the main shell 111. The bottom plate 112 is opposite to the opening 011. The accommodating cavity 001 can communicate with the outside of the housing 11 through the opening 011. The lens 1 is mounted on the first base 2, and extends through the opening 011. The printed circuit board 8 mounted in the accommodating cavity 001 extends through the through hole 1111 to the outside of the housing 11, thereby being electrically connected to the external power supply.

In practical applications, the printed circuit board 8 is a flexible printed circuit board (FPC). The printed circuit board 8 has eight terminals, i.e., two first terminals 81, two second terminals 82, two third terminals 83, and two fourth terminals 84. A part of the printed circuit board 8 mounted in the accommodating cavity 001 is laid on the bottom plate 112, and the bottom base 4 abuts against the printed circuit board 8. The first terminal 81 and the second terminal 82 are symmetrical with respect to the second axis 02. The two first terminals 81 are symmetrical with respect to the first axis 01. The two second terminals 82 are symmetrical with respect to the first axis 01. The two first terminals 81 are respectively electrically connected to two reset members 71 located at the same side of the second axis 02. The two second terminals 82 are respectively electrically connected to two reset members 71 located at the same side of the second axis 02. The third terminal 83 and the fourth terminal 84 are symmetrical with respect to the first axis 01. The two third terminals 83 are symmetrical with respect to the second axis 02. The two fourth terminals 84 are symmetrical with respect to the second axis 02. The two third terminals 83 are respectively electrically connected to the second shape memory alloy wire 61 located at the same side of the first axis 01. The two fourth terminals 84 are respectively electrically connected to the second shape memory alloy wire 61 located at the same side of the first axis 01.

Embodiment 2

Referring to FIG. 2, FIG. 3, FIG. 5, FIG. 7, and FIG. 16, a distinct difference between Embodiment 2 and Embodiment 1 lies in extension directions of the second elastic arm 715. In Embodiment 1, the second elastic arm 715 is twisted and bent along a direction parallel to the optical axis 03. However, in Embodiment 2, the second elastic arm 715 extends along a direction perpendicular to a line connecting the second connection portion 712 with the third connection portion 713.

With such configuration, restoring forces applied by the reset member 71 to the lens driving module in two directions can be more uniform and balanced.

In addition to the above differences, other structures of the lens driving module 100 provided in Embodiment 2 can be designed with reference to Embodiment 1, which will not be repeated herein.

Embodiment 3

Referring to FIG. 2, FIG. 3, FIG. 4, FIG. 5, and FIG. 6, a distinct difference between Embodiment 3 and Embodiments 1 or 2 lies in positions of the reset members 71. In Embodiment 1 or Embodiment 2, the reset members 71 are provided at two opposite sides of the bottom base 4 along the first axis 01. In the present embodiment, the reset member 71 is provided at two opposite sides of the bottom base 4 along the second axis 02. Correspondingly, in the present embodiment, the first fixation end 511 and the third fixation end 513 of the first shape memory alloy wire 51 are electrically connected to the printed circuit board 8. The second shape memory alloy wire 61 is electrically connected to the printed circuit board 8 through the reset member 71. The fourth fixation end 611 and the sixth fixation end 613 are respectively electrically connected to two reset members 71 located at a same side. The second protruding post 23, the third protruding post 33, and the fourth protruding post 42 are provided on the first base 2, the second base 3, and the bottom base 4 along the second axis 02, respectively.

In addition to the above difference, other structures of the lens driving module 100 provided in Embodiment 3 can be designed with reference to Embodiment 1 or Embodiment 2, which will not be repeated herein.

Embodiment 4

Referring to FIG. 2, FIG. 3, FIG. 4, FIG. 5, FIG. 7, FIG. 15, and FIG. 16, a distinct difference between Embodiment 4 and Embodiment 1 or 2 lies in the number of the reset members 71 provided at each side of the two opposite sides of the bottom base 4 along the first axis 01. In Embodiment 1 or 2, two reset members 71 are provided at each side. In the present embodiment, only one reset member 71 is provided at each side, and two reset members 71 are centrally symmetrical about the optical axis 03. Correspondingly, in the present embodiment, the first fixation end 511 is electrically connected to the second connection portion 712 located at a same side as the first fixation end 511, and the third fixation end 513 is electrically connected to the printed circuit board 8 through a wire. In another embodiment, the third fixation end 513 is electrically connected to the second connection portion 712 located at the same side as the third fixation end 513, and the first fixation end 511 is electrically connected to the printed circuit board 8 through a wire, thereby achieving the electrical connection between the first shape memory alloy wire 51 and the printed circuit board 8. At this time, the number of second protruding post 23 is two, that is, the two second protruding posts 23 are provided at two opposite sides of the first base 2 along the first axis 01, respectively. The two second protruding posts 23 are centrally symmetrical about the optical axis 03. The number of the third protruding post 33 is two, that is, the two third protruding posts 33 are provided at two opposite sides of the second base 3 along the first axis 01, respectively. The two third protruding posts 33 are centrally symmetrical about the optical axis 03. The number of the fourth protruding post 42 is two, that is, the two fourth protruding posts 42 are provided at two opposite sides of the bottom base 4 along the first axis 01, and the two fourth protruding posts 42 are centrally symmetrical about the optical axis 03.

In addition to the above difference, other structures of the lens driving module 100 provided in Embodiment 4 can be designed with reference to Embodiment 1 or Embodiment 2, which will not be repeated herein.

Embodiment 5

Referring to FIG. 2, FIG. 3, FIG. 4, FIG. 5, and FIG. 6, a distinct difference between Embodiment 5 and Embodiment 3 lies in the number of the reset member 71 provided at each side of two opposite sides of the bottom base 4 along the second axis 02. In Embodiment 3, each side of the bottom base 4 is provided with two reset members 71. In the present embodiment, each side of two opposite sides of the bottom base 4 is provided with only one reset member 71, and the two reset members 71 are centrally symmetrical with respect to the optical axis 03. Correspondingly, in the present embodiment, the fourth fixation end 611 is electrically connected to the reset member 71 at the same side as the fourth fixation end 611, and the sixth fixation end 613 is electrically connected to the printed circuit board 8 through a wire. In another embodiment, the sixth fixation end 613 is electrically connected to the reset member 71 located at the same side as the sixth fixation end 613, and the fourth fixation end 611 is electrically connected to the printed circuit board 8 through a wire, thereby electrically connecting the second shape memory alloy wire 61 to the printed circuit board 8. The number of the second protruding post 23 is two, that is, the two second protruding posts 23 are provided at two opposite sides of the first base 2 along the second axis 02, respectively, and the two second protruding posts 23 are centrally symmetrical about the optical axis 03. The number of the third protruding post 33 is two, that is, the two third protruding posts 33 are provided at two opposite sides of the second base 3 along the second axis 02, respectively, and the two third protruding posts 33 are centrally symmetrical about the optical axis 03. The number of the fourth protruding post 42 is two, that is, the two fourth protruding posts 42 are provided at two opposite sides of the bottom base 4 along the second axis 02, respectively, and the two fourth protruding posts 42 are centrally symmetrical about the optical axis 03.

In addition to the above difference, other structures of the lens driving module 100 provided in Embodiment 5 can be designed with reference to Embodiment 3, which will not be repeated herein.

In addition to the above differences, other structures of the lens driving module 100 provided in Embodiment 5 can be designed with reference to Embodiment 1 or Embodiment 2, which will not be repeated herein.

The above are merely some embodiments of the present disclosure. It should be noted here that for those skilled in the art, modifications can be made without departing from the inventive concept of the present disclosure, but these all fall into the protection scope of the present disclosure.

What is claimed is:

1. A lens driving module, comprising: a lens, a first base, a second base, a bottom base, a first driving assembly, a second driving assembly, a reset assembly, and a printed circuit board, wherein the lens is mounted on the first base, the first base is rotatably mounted on the second base about a first axis, the second base is rotatably mounted on the bottom base about a second axis, and the first axis and the second axis are perpendicular to each other and are perpendicular to an optical axis of the lens;

the first driving assembly is configured to drive the first base to rotate about the first axis, and the second driving assembly is configured to drive the second base to rotate about the second axis; and the reset assembly comprises reset members provided at two opposite sides of the bottom base along the first axis or the second axis, wherein each of the reset members comprises a first connection portion, a second connection portion, a third connection portion, a first elastic arm connected between the first connection portion and the second connection portion, and a second elastic arm connected between the second connection portion and the third connection portion, wherein the first connection portion is connected to the first base, the second connection portion is connected to the second base, the third connection portion is connected to the bottom base, the first elastic arm is configured to reset the first base, and the second elastic arm is configured to reset the second base;

wherein the first connection portion, the second connection portion, the third connection portion, the first elastic arm, and the second elastic arm of each of the reset members are formed into one piece;

wherein two of the reset members are arranged at each of sides of the bottom base, and two of the reset members at one of the sides of the bottom base are symmetrical to each other with respect to the optical axis;

wherein the first driving assembly comprises at least one first shape memory alloy wire configured to connect the first base with the second base;

the second driving assembly comprises at least one second shape memory alloy wire configured to connect the second base with the bottom base; and the at least one first shape memory alloy wire or the at least one second shape memory alloy wire are electrically connected to the printed circuit board through the reset members.

2. The lens driving module as described in claim 1, wherein the first elastic arm has a U-shaped structure, wherein the U-shaped structure has two ends respectively connected to the first connection portion and the second connection portion and has an opening facing towards a direction perpendicular to the optical axis; and the second elastic arm has a wave-shaped structure, wherein the wave-shaped structure has two ends respectively connected to the second connection portion and the third connection portion.

3. The lens driving module as described in claim 1, wherein the at least one first shape memory alloy wire is electrically connected to the printed circuit board through at least one of the reset members; each of the at least one first shape memory alloy wire comprises a first fixation end, a second fixation end, a third fixation end, a first extension section connected between the first fixation end and the second fixation end, and a second extension section connected between the second fixation end and the third fixation end, wherein the first fixation end is connected to the second base and electrically connected to one of the second connection portions of the reset members that is located at a same side as the first fixation end, the second fixation end is connected to the first base, and the third fixation end is connected to the second base and electrically connected to another second connection portion of the second connection portions of the reset members that is located at a same side as the third fixation end; and each of the at least one second shape memory alloy wire comprises a fourth fixation end, a fifth fixation end, a sixth fixation end, a third extension section connected between the fourth fixation end and the fifth fixation end, and a fourth extension section connected between the fifth fixation end and the sixth fixation end, wherein the fourth fixation end is connected to the bottom base and electrically connected to the printed circuit board, the fifth fixation end is connected to the second base, and the sixth fixation ends is connected to the bottom base and electrically connected to the printed circuit board.

4. The lens driving module as described in claim 3, wherein the at least one first shape memory alloy wires comprises at least two first shape memory alloy wires, the at least one second shape memory alloy wire comprises at least two second shape memory alloy wires, wherein the second fixation ends of the at least two first shape memory alloy wires provided at two opposite sides of the bottom base are provided at two sides of the first axis along the first axis; and the fifth fixation ends of the at least two second shape memory alloy wires provided at another two opposite sides of the bottom base are provided at two sides of the second axis along the second axis.

5. The lens driving module as described in claim 1, further comprising:

a first rolling assembly sandwiched between the first base and the second base and arranged along the first axis; and a second rolling assembly sandwiched between the second base and the bottom base and arranged along the second axis.

6. The lens driving module as described in claim 5, wherein the first rolling assembly comprises two first rolling balls, the second base is provided with two first grooves for respectively accommodating the two first rolling balls, and a surface of the first base facing towards the two first rolling balls is concavely provided with first concave spherical surfaces for respectively abutting against the two first rolling balls; and the second rolling assembly comprises two second rolling balls, the bottom base is provided with two second grooves for respectively accommodating the two second rolling balls, and a surface of the second base facing towards the two second rolling balls is concavely provided with second concave spherical surfaces for respectively abutting against the two second rolling balls.

7. The lens driving module as described in claim 4, wherein two opposite sides of the first base that are arranged along the first axis are convexly provided with two first protruding posts for connecting the second fixation ends, and the two first protruding posts are respectively provided at two sides of the first axis;

each of the two first protruding posts is provided with a first blocking plate that prevents one of the second fixation ends from dropping from one of the two first protruding posts;

two opposite sides of the second base that are arranged along the second axis are convexly provided with two fifth protruding posts for connecting the fifth fixation ends, and the two fifth protruding posts are respectively provided at two sides of the second axis; and each of the two fifth protruding posts is provided with a second blocking plate that prevents one of the fifth fixation ends from dropping from one of the two fifth protruding posts.

8. The lens driving module as described in claim 2, wherein the first connection portion, the second connection portion, the third connection portion, the first elastic arm, and the second elastic arm of each of the reset members are formed into one piece.

* * * * *